(12) United States Patent
Lee

(10) Patent No.: US 8,866,164 B2
(45) Date of Patent: *Oct. 21, 2014

(54) NITRIDE SEMICONDUCTOR LIGHT EMITTING DEVICE AND METHOD OF MANUFACTURING THE SAME

(75) Inventor: Sang Youl Lee, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/758,649

(22) Filed: Apr. 12, 2010

(65) Prior Publication Data

US 2010/0193834 A1    Aug. 5, 2010

Related U.S. Application Data

(63) Continuation of application No. 11/580,888, filed on Oct. 16, 2006, now Pat. No. 7,709,847.

(30) Foreign Application Priority Data

Oct. 17, 2005  (KR) ........................ 10-2005-0097326

(51) Int. Cl.
*H01L 33/00* (2010.01)
*H01L 33/20* (2010.01)
*H01L 33/08* (2010.01)
*H01L 33/44* (2010.01)

(52) U.S. Cl.
CPC ................ *H01L 33/20* (2013.01); *H01L 33/08* (2013.01); *H01L 33/44* (2013.01)
USPC .......... 257/90; 257/91; 257/95; 257/E33.025; 257/E33.033; 257/E33.067

(58) Field of Classification Search
CPC ......... H01L 33/32; H01L 33/08; H01L 33/20; H01L 33/24

USPC ................ 257/90, 91, 95, E33.025, E33.033, 257/E33.067
See application file for complete search history.

(56) References Cited

U.S. PATENT DOCUMENTS

| 5,260,588 A | 11/1993 | Ohta et al. |
| 6,329,676 B1 | 12/2001 | Takayama et al. |

(Continued)

FOREIGN PATENT DOCUMENTS

| JP | 2001-024222 A | 1/2001 |
| JP | 2003-133584 A | 5/2003 |

(Continued)

OTHER PUBLICATIONS

Weber, Thermal effects in solid-state laser materials, Optical Materials 11, 1999, pp. 245-254.

(Continued)

*Primary Examiner* — Minchul Yang
(74) *Attorney, Agent, or Firm* — Birch, Stewart, Kolasch & Birch, LLP

(57) ABSTRACT

A semiconductor light emitting device having a light emitting structure including at least one first conductive GaN based semiconductor layer, an active layer above the at least one first conductive GaN based semiconductor layer, and at least one second conductive GaN based semiconductor layer above the active layer, a plurality of patterns disposed from the at least one second conductive GaN based semiconductor layer through a portion of the at least one first conductive GaN based semiconductor layer, and an insulating member on the plurality of patterns. The plurality of patterns include a lower part contacting with the light emitting structure and a upper part contacting with the light emitting structure. A first base angle of the lower part is different from the second base angle of the upper part.

15 Claims, 7 Drawing Sheets

(56) References Cited

U.S. PATENT DOCUMENTS

| | | |
|---|---|---|
| 7,709,847 B2 | 5/2010 | Lee |
| 2001/0054712 A1 | 12/2001 | Aoki |
| 2003/0132447 A1 | 7/2003 | Yukimoto |
| 2004/0079959 A1 | 4/2004 | Udagawa |
| 2004/0084682 A1 | 5/2004 | Illek et al. |
| 2005/0093016 A1 | 5/2005 | Yamamoto et al. |
| 2005/0230700 A1 | 10/2005 | Stefanov et al. |
| 2006/0071225 A1 | 4/2006 | Beeson et al. |
| 2007/0126013 A1 | 6/2007 | Kim et al. |

FOREIGN PATENT DOCUMENTS

| | | |
|---|---|---|
| KR | 10-2002-0021247 A | 3/2002 |
| KR | 10-2004-0008962 B1 | 1/2004 |
| KR | 10-2005-0081139 A | 8/2005 |
| KR | 10-0643473 B1 | 11/2006 |
| KR | 10-0668964 B1 | 1/2007 |
| KR | 10-0668965 B1 | 1/2007 |
| WO | WO 02/23640 A1 | 3/2002 |

OTHER PUBLICATIONS

Entire English-language translation of JP 2001-024222 A.

NITRIDE SEMICONDUCTOR LIGHT EMITTING DEVICE AND METHOD OF MANUFACTURING THE SAME

The present application is a 37 C.F.R. §1.53 (b) continuation of U.S. patent application Ser. No. 11/580,888 filed Oct. 16, 2006, now U.S. Pat. No 7,709,847 which claims priority on Korean Patent Application No. 10-2005-0097326, filed Oct. 17, 2005, the entire contents of which are hereby incorporated by reference.

BACKGROUND OF THE INVENTION

1. Field of the Invention

The present invention relates to a nitride semiconductor light emitting device and a method of manufacturing the same.

2. Description of the Related Art

A GaN nitride semiconductor is one of nitride semiconductors according to a related art. The GaN nitride semiconductor has been applied to an optical device such as a green or blue light emitting diode (LED) and high-speed switching and high-power electronic devices such as a metal semiconductor field effect transistor (MESFET) and a high electron mobility transistor (HEMT).

Particularly, in a light emitting device such as an LED and a semiconductor laser diode, a nitride semiconductor that has a p-type conductivity and emits blue light by disposing a group □ element such as Mg, Zn, or the like in a position of Ga, which is a group □ element of a GaN nitride semiconductor, is in the limelight.

FIG. 1A is a sectional view of a nitride semiconductor light emitting device according to a related art.

Referring to FIG. 1A, a light emitting device having a multiple quantum well (MQW) structure, which is one of GaN nitride semiconductors according to the related art, is grown on a substrate 1 generally formed of sapphire. A polycrystalline thin layer is grown into a buffer layer 2 on the substrate 1 at low temperature, and then a GaN underlayer 3 is stacked on the buffer layer 2 at high temperature. An active layer 4 for light emission is disposed on the GaN underlayer 3, and an AlGaN electric barrier layer 5 doped with Mg, an InGaN layer 6 doped with Mg, and a GaN layer 7 doped with Mg, which switch to p-type by a thermal annealing process, are sequentially stacked on the active layer 4.

An insulating layer 8 is formed on the GaN layer 7 doped with Mg and the GaN underlayer 3, and a p-type electrode 9 and an n-type electrode 10 are formed thereon, which forms a light emitting device.

FIG. 1B is a view illustrating light emitting of a nitride semiconductor light emitting device according to a related art.

Referring to FIG. 1B, the light emitted from the active layer 4 moves along light paths □, □ and □.

When light is incident from a material with an optically large refractive index to a material with a small refractive index, if an incident angle is greater than a predetermined angle (critical angle), the light is totally reflected on the interface. The light path □ is caused by such a total reflection.

Therefore, the light moving along the light path □ decreases a light emitting efficiency of the light emitting device including the active layer 4.

Also, in the related art, when the nitride semiconductor is etched to form the n-type electrode, then-type nitride semiconductor is etched using dry etching. This dry etching damages the nitride semiconductor, decreasing an optical characteristic and a current-voltage characteristic of the nitride semiconductor.

SUMMARY OF THE INVENTION

Accordingly, the present invention is directed to a nitride semiconductor light emitting device and a method of manufacturing the same that substantially obviate one or more problems due to limitations and disadvantages of the related art.

The present invention provides a nitride semiconductor light emitting device and a method of manufacturing the same capable of enhancing a light emitting efficiency by improving a light emitting structure thereof.

The present invention provides a nitride semiconductor light emitting device and a method of manufacturing the same capable of enhancing a light emitting efficiency and a reliability thereof by manufacturing a light emitting device using an etching method that does not damage the light emitting device.

Additional advantages, objects, and features of the invention will be set forth in part in the description which follows and in part will become apparent to those having ordinary skill in the art upon examination of the following or can be learned from practice of the invention. The objectives and other advantages of the invention can be realized and attained by the structure particularly pointed out in the written description and claims hereof as well as the appended drawings.

The embodiment of the invention provides nitride semiconductor light emitting device comprising: a first nitride layer comprising at least N-type nitride layer; an insulating member formed on the first nitride layer having a predetermined pattern; an active layer formed in both sides of the insulating member on the first nitride layer to emit light; and a second nitride layer formed in both sides of the insulating member on the active layer and the second nitride layer comprises at least a P-type nitride layer.

The embodiment of the present invention provides a nitride semiconductor light emitting device including: a first nitride layer comprising at least N-type nitride layer; an active layer formed on the first nitride layer to emit light; a second nitride layer formed on the active layer and the second nitride layer comprises at least a P-type nitride layer; and a space having one inclination side or more of a predetermined angle with respect to the first nitride layer is formed in the second nitride layer, and the active layer.

The embodiment of the present invention provides a method of fabricating a nitride semiconductor light emitting device, the method including: forming a first nitride layer comprising at least one N-type nitride layer on a substrate; forming an insulating member having a predetermined pattern on the first nitride layer; forming an active layer to emit light in both sides of the insulating member on the first nitride layer; and forming a second nitride layer comprising at least one P-type nitride layer in both sides of the insulating member on the active layer.

The embodiment of the present invention provides a method of fabricating a nitride semiconductor light emitting device, the method including: forming a first nitride layer comprising at least one N-type nitride layer on a substrate; forming an insulating member having a predetermined pattern on the first nitride layer; forming an active layer to emit light in both sides of the insulating member on the first nitride layer; forming a second nitride layer comprising at least one P-type nitride layer in both sides of the insulating member on the active layer; and removing the insulating member having the predetermined pattern to form a space formed of at least one inclination side in the second nitride layer and the active layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment (s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings.

Embodiments of the present invention illustrate a nitride semiconductor light emitting device having an MQW structure, but are not limited thereto. In the Description, the term, 'on' represents that an element is contacted directly or indirectly to another element.

First Embodiment

FIGS. 2 to 6 are sectional views illustrating a method of manufacturing a nitride semiconductor light emitting device according to a first embodiment of the present invention.

The first embodiment of the present invention illustrates a nitride semiconductor light emitting device having the PN junction structure where a P-type semiconductor layer such as a P-type nitride layer and an N-type semiconductor layer are respectively formed in an upper side and a lower side, but is not limited thereto.

Figure 1A:
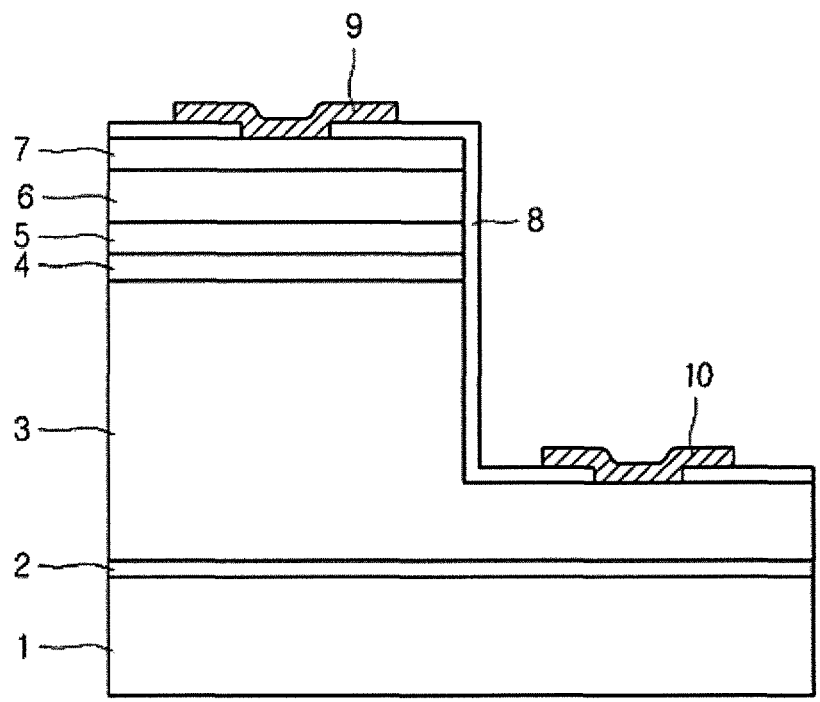
FIG. 1A is a sectional view of a nitride semiconductor light emitting device according to a related art.
Figure 1B:
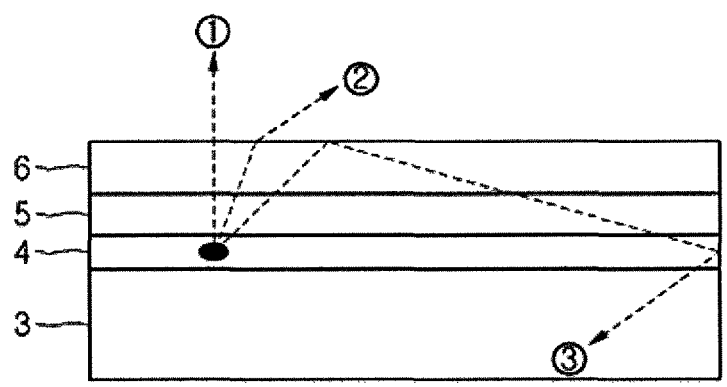
FIG. 1B is a view illustrating a light emitting of a nitride semiconductor light emitting device according to a related art.
Figure 2:
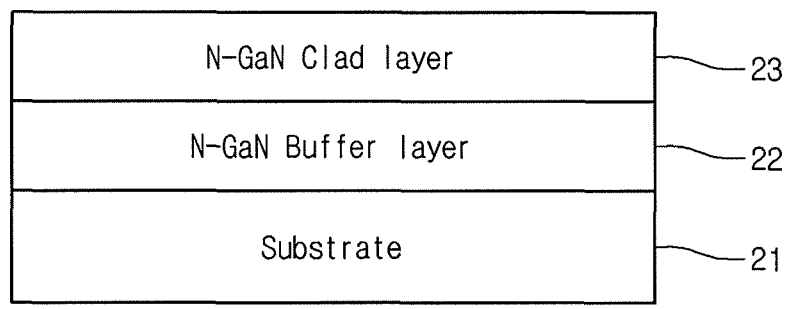
FIGS. 2 to 6 are sectional views illustrating a method of manufacturing a nitride semiconductor light emitting device according to a first embodiment of the present invention.

Referring to FIG. 2, a GaN buffer layer 22 and an N-type nitride layer 23 are formed on a substrate 21. The buffer layer 22 can comprise an N-type GaN buffer layer, and the N-type nitride layer 23 can comprise an N-type nitride cladding layer, N-type contact layer etc.

The substrate 21 formed of sapphire or Sic is mounted in a predetermined chamber such as a metal organic chemical vapor deposition (MOCVD) reactor (not shown), and the N-type GaN buffer layer 22 is grown on the substrate 21.

For example, $NH_3$ of $4.0*10^{-2}$ mol/min and trimethylgallium (TMG) of $1.0*10^{-4}$ mol/min can be supplied to the MOCVD reactor mounted with the substrate 21 to grow the N-type GaN buffer layer 22 to a thickness of approximately 3 μm.

Next, a silane gas including an N-type dopant such as $NH_3$, TMG, and Si is supplied to grow the N-type GaN cladding layer 23 to a predetermined thickness on the N-type GaN buffer layer 22.

Figure 3:
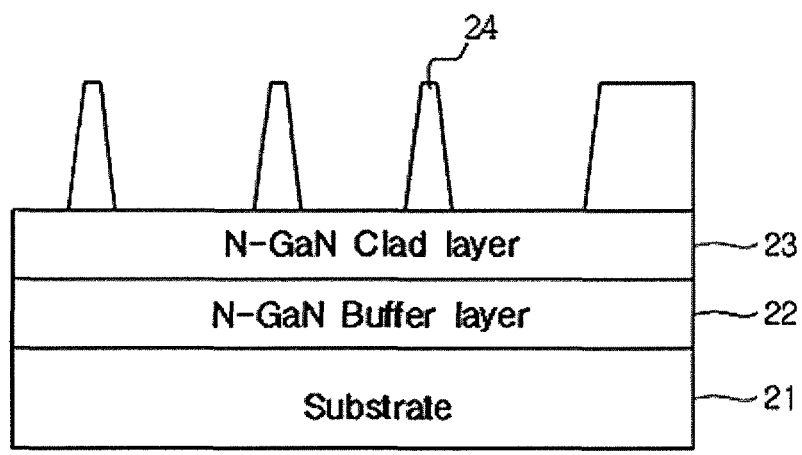

Referring to FIG. 3, an insulating member 24 with a predetermined pattern is formed on the N-type GaN cladding layer 23.

The insulating member 24 with the predetermined pattern is formed with a predetermined height, in detail, a height of a P-type GaN contact layer 27 to be formed later or more, such that the insulating member 24 can contact a P-type electrode 28 to be formed later.

The insulating member 24 can have a pattern of a trapezoid. In particular, the trapezoid can have a bottom side longer than a top side. The trapezoid can be an isosceles trapezoid.

Since each trapezoid of the pattern of the insulating member 24 has a base angle of 10 to 80°, the light generated from the active layer 25 is reflected on an inclination side of the insulating member 24 and emitted to the outside of the light emitting device. Therefore, a decrease in a light emitting efficiency caused by a total reflection can be prevented.

For example, the insulating member 24 can be formed with a base angle of approximately 30°, such that the light generated from the active layer 25 is reflected on an inclination side of the insulating member 24 and emitted to the outside of the light emitting device, remarkably enhancing the light emitting efficiency.

Figure 12:
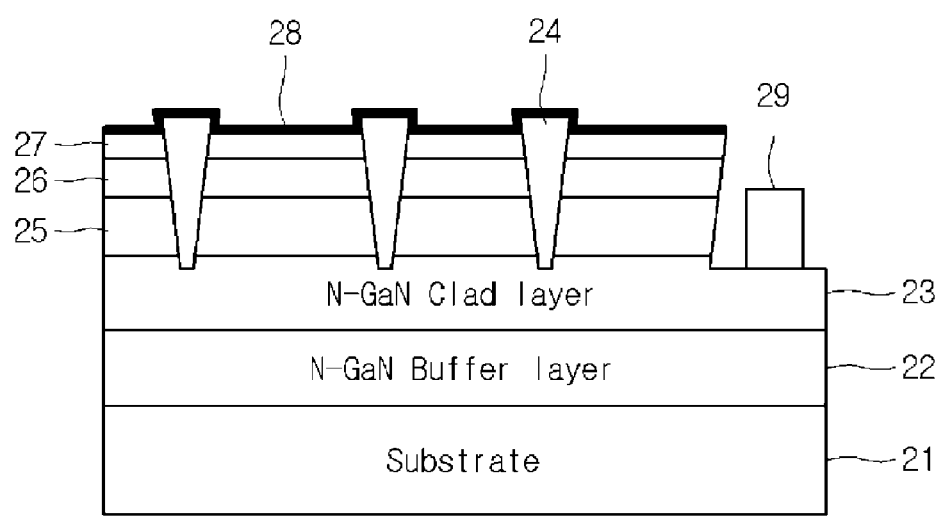
FIG. 12 is a view illustrating a light emitting device according to a modified embodiment of a first embodiment of the present invention.

The first embodiment of the present invention illustrates the trapezoid having a bottom side longer than a top side as the pattern of the insulating member 24, but is not limited thereto. The pattern of the insulating member 24 can be a reverse mesa, as seen in FIG. 12, or a rectangle.

The insulating member 24 with the predetermined pattern can be formed of silicon oxide or silicon nitride that have an excellent insulating characteristic and do not absorb light. For example, the insulating member 24 with the predetermined pattern can be formed of one of $SiO_2$ and $Si_xN_x$. Therefore, the insulating member 24 can effectively reflect the light generated from the active layer 25 to remarkably enhance the light emitting efficiency.

A method of forming of the insulating member 24 with the predetermined pattern will be described.

An insulating member (not shown) is formed on the N-type GaN cladding layer 23 and a photoresist pattern (not shown) having a predetermined pattern is formed on the insulating member. Next, the insulating member is etched using the photoresist pattern as a mask, and the photoresist pattern is removed to form the insulating member 24 with the predetermined pattern.

In order to form the insulating member 24, anisotropy wet etching can be used, and an HF can be used as an etching solution in the anisotropy wet etching.

An N-type GaN cladding layer can be additionally formed in both sides of the insulating member 24 with the predetermined pattern on the N-type GaN cladding layer 23. Therefore, the active layer 25 can be formed higher than a bottom of the insulating member 24 with the predetermined pattern, such that the light generated from the active layer 25 can be effectively reflected on an inclination side of the insulating member 24, enhancing the light emitting efficiency.

Figure 4:
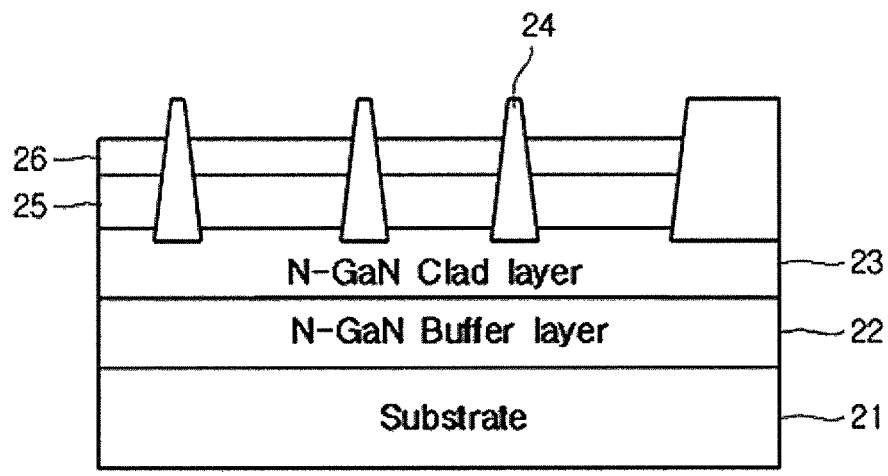

Referring to FIG. 4, the active layer 25 and the P-type nitride layer are sequentially formed in both sides of the insulating member 24 with the predetermined pattern. The P-type nitride layer can comprise a P-type nitride cladding layer 26, a P-type contact layer 27 which will be described etc.

For example, $NH_3$, TMG, and trimethylindium (TMI) are supplied using a nitride as a carrier gas at a growth temperature of approximately 780□ to grow the active layer 25 formed of InGaN to a thickness of approximately 30 to 100 μm. Here, the active layer 25 can have a stacked structure grown with a difference in a mole ratio of each element of InGaN.

Next, the P-type nitride cladding layer 26 is grown to a thickness of several hundreds to several thousands Å on the active layer 25. For example, TMG, trimethylaluminum (TMA), (EtCp2Mg) {Mg $(C_2H_5C_5H_4)_2$}, and $NH_3$ can be supplied using hydrogen as a carrier gas at approximately 1000□ to form the P-type nitride cladding layer 26 such as AlGaN.

Figure 5:
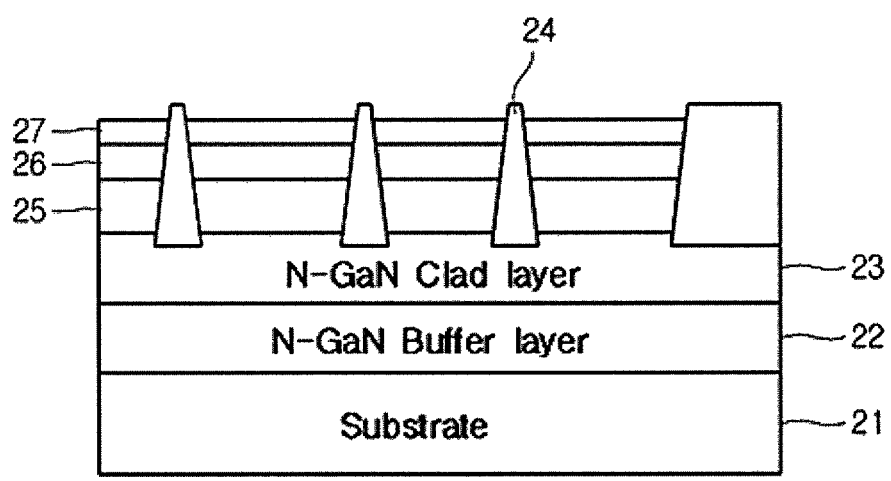

Referring to FIG. 5, the P-type contact layer 27 is grown to a thickness of several tens to several hundreds Å on the P-type nitride cladding layer 26. The P-type contact layer 27 can be the P-type GaN contact layer 27.

For example, TMG, (EtCp2Mg) {Mg $(C_2H_5C_5H_4)_2$}, and $NH_3$ can be supplied using a nitride as a carrier gas at a lowered temperature to grow the P-type GaN contact layer 27 doped with Mg to a thickness of several tens to several hundreds Å on the P-type nitride cladding layer 26. Next, a hole concentration is adjusted to the maximum through a heat treatment.

Figure 6:
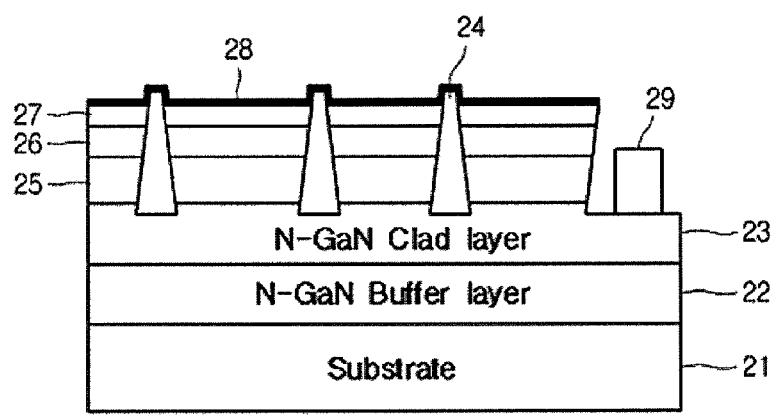

Referring to FIG. 6, the insulating member 24 in an N-type electrode region is etched using wet etching, for example, anisotropy wet etching, to expose the N-type GaN cladding layer 23.

Herein, the reason why the wet etching is used is that dry etching can cause more damage of the nitride semiconductor layer, for example, a loss and deformation of the nitride semiconductor layer by Plasma is more than a loss and deformation of the nitride semiconductor layer by the wet etching.

Next, an N-type electrode 29 formed of Ti is formed on the exposed N-type GaN cladding layer 23.

The P-type electrode 28 is formed on the P-type GaN contact layer 27 and the insulating member 24 with the predetermined pattern. Here, the P-type electrode 28 can be a transparent electrode formed of one of ITO, ZnO, RuOx, TiOx, and IrOx.

The nitride semiconductor light emitting device according to the first embodiment of the present invention has the PN junction structure where a P-type semiconductor layer such as the P-type nitride layer 26, 27 and an N-type semiconductor layer such as the N-type nitride layer 23 are formed in an upper side and a lower side respectively.

Figure 7:
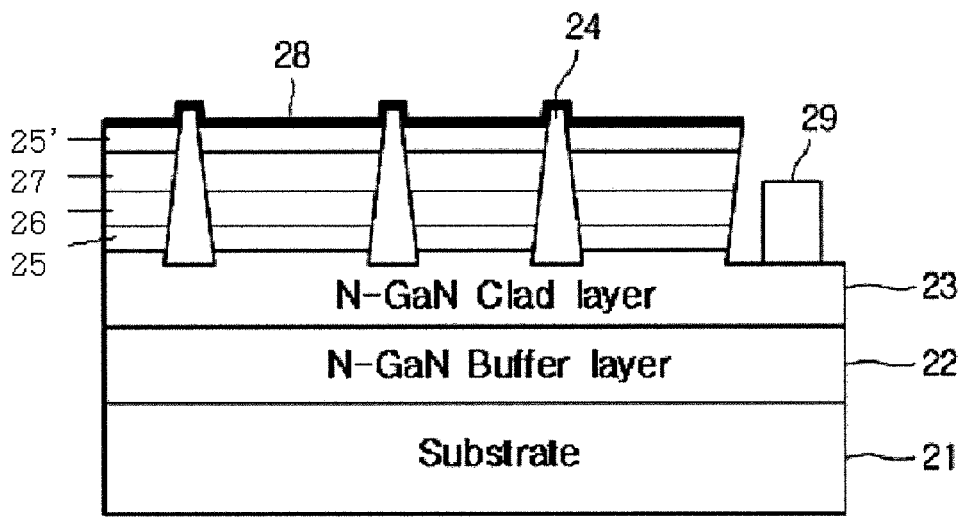
FIG. 7 is a sectional view illustrating a method of manufacturing a nitride semiconductor light emitting device according to a modified embodiment of a first embodiment of the present invention.

Also, referring to FIG. 7, the nitride semiconductor light emitting device according to a modified embodiment of the first embodiment of the present invention has an NPN junction structure where an N-type semiconductor layer 25' is further formed on the P-type semiconductor layer such as the P-type nitride layer 26, 27. In the semiconductor light emitting device of the NPN junction structure, both upper and lower layers are formed of an N-type semiconductor layer and a P-type semiconductor layer is formed between the upper and lower layers.

The light emitting efficiency of the light emitting device according to the first embodiment of the present invention will be described with reference to FIG. 8.

Figure 8:
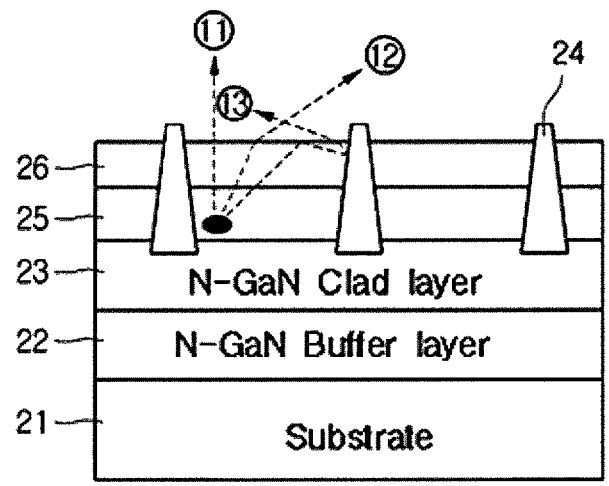
FIG. 8 is a view illustrating a light emitting of a nitride semiconductor light emitting device according to a first embodiment of the present invention.

FIG. 8 is a view illustrating a light emitting of a nitride semiconductor light emitting device according to a first embodiment of the present invention. Light paths □, □ and □ are generated from the active layer 25. The light of the light path □ is reflected on an inclination side of the insulating member 24 and emitted to the outside of the light emitting device. Therefore, a decrease in the light emitting efficiency due to a total reflection can be prevented.

As described above, according to the nitride semiconductor light emitting device and the method of manufacturing the same according to the first embodiment of the present invention, the light generated from the active layer is almost reflected to the outside of the nitride semiconductor light emitting device by the insulating member with the predetermined pattern, remarkably enhancing the light emitting efficiency.

Also, since the N-type electrode 29 is formed using the wet etching, minimizing a damage of the nitride semiconductor layer.

Also, the first embodiment of the present invention can be applied to the semiconductor light emitting device of the NPN junction structure to enhance the light emitting efficiency.

Second Embodiment

Figure 9:
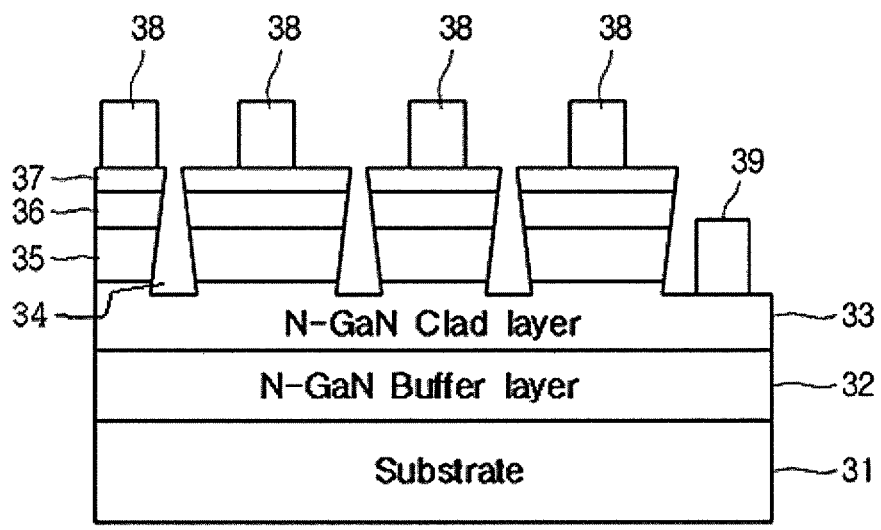
FIG. 9 is a sectional view of a nitride semiconductor light emitting device according to a second embodiment of the present invention.

In a second embodiment of the present invention, as illustrate in FIG. 9, the insulating member can be removed to enhance the reflectance of light.

The method of fabricating the nitride semiconductor light emitting device according to the first embodiment can be employed in a nitride semiconductor light emitting device according to a second embodiment of the present invention illustrated in FIG. 9.

That is, a GaN buffer layer 32 and an N-type GaN cladding layer 33 are sequentially formed on a sapphire substrate 31. Next, an insulating member that is formed of one of $SiO_2$ and $Si_xN_x$ and has a predetermined pattern is formed on the N-type GaN cladding layer 33. The predetermined pattern of the insulating member can be a trapezoid. In particular, the trapezoid can have a bottom side longer than a top side. The trapezoid can be an isosceles trapezoid.

The trapezoid of the pattern of the insulating member can have a base angle of 10 to 80°. The insulating member is removed later to form a predetermined space 34. The light generated form an active layer 35 to be formed later is reflected on an inclination side of the space 34 and emitted to the outside of the light emitting device. Therefore, a decrease in a light emitting efficiency due to a total reflection can be prevented.

The second embodiment of the present invention illustrates the trapezoid having a bottom side longer than a top side as the pattern of the insulating member, but is not limited thereto. That is, the pattern of the insulating member can have a section of a reverse mesa or a rectangle.

The active layer 35, a P-type nitride cladd layer 36, and a P-type contact layer 37 are sequentially formed in both sides of the insulating member.

Next, a heat treatment is performed at a predetermined temperature to adjust a hole concentration of the P-type contact layer 37 to the maximum.

Next, unlike the first embodiment of the present invention, the insulating member with the predetermined pattern is removed to form the space 34 penetrating the P-type contact layer 37, the P-type nitride cladd layer 36, and the active layer 35 and expose the N-type nitride layer 33 in an N-type electrode region of substrate 31. The space 34 includes a plurality of inclination sides.

Next, an N-type electrode 39 formed of Ti, or the like is formed on the exposed N-type nitride layer 33, and a P-type electrode 38, which is a transparent electrode formed of one of ITO, ZnO, RuOx, TiOx, and IrOx, is formed on the P-type contact layer 37.

The nitride semiconductor light emitting device according to the second embodiment of the present invention has a PN junction structure where a P-type semiconductor layer such as the P-type nitride layer 36 and an N-type semiconductor layer such as the N-type nitride layer 33 are formed in an upper side and a lower side respectively.

Figure 10:
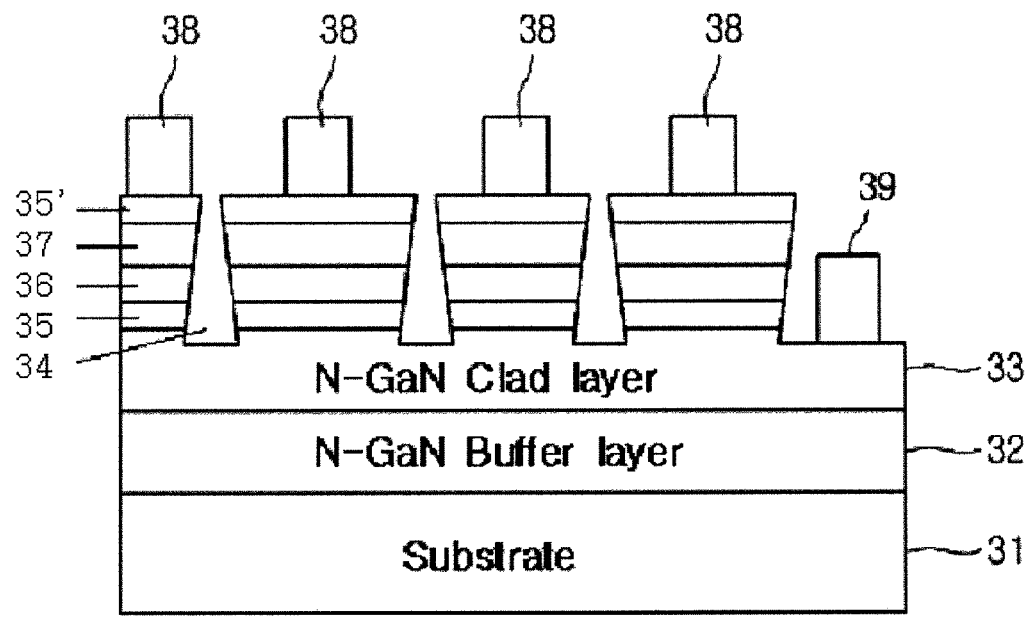
FIG. 10 is a sectional view illustrating a method of manufacturing a nitride semiconductor light emitting device according to a modified embodiment of a second embodiment of the present invention.

Referring to FIG. 10, a nitride semiconductor light emitting device according to a modified embodiment of the second embodiment of the present invention has an NPN junction structure where an N-type semiconductor layer 35' is further formed on the P-type semiconductor layer such as the P-type nitride layer 36, 37. In the semiconductor light emitting device of the NPN junction structure, both upper and lower layers are formed of an N-type semiconductor layer and a P-type semiconductor layer is formed between the upper and lower layers.

The light emitting efficiency of the light emitting device according to the second embodiment of the present invention will be described with reference to FIG. 11.

Figure 11:
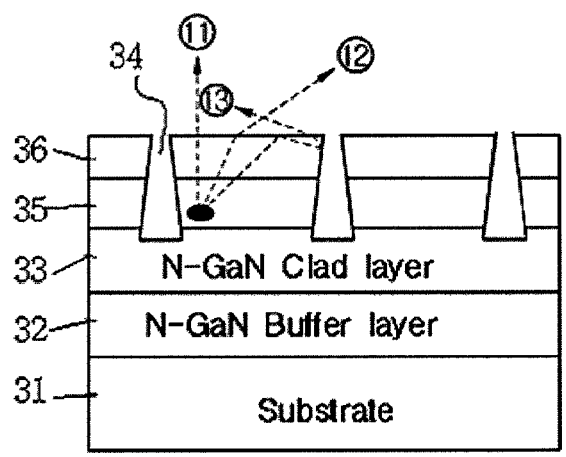
FIG. 11 is a view illustrating a light emitting of a nitride semiconductor light emitting device according to a second embodiment of the present invention.

FIG. 11 is a view illustrating a light emitting of a nitride semiconductor light emitting device according to a second embodiment of the present invention. Light paths □, □ and □ are generated from the active layer 35. The light of the light path □ is reflected on an inclination side of the space 34 and emitted to the outside of the light emitting device. Therefore, a decrease in the light emitting efficiency due to a total reflection can be prevented.

As described above, according to the nitride semiconductor light emitting device and the method of manufacturing the same according to the second embodiment of the present invention, the light generated from the active layer is almost reflected to the outside of the nitride semiconductor light emitting device by the insulating member with the predetermined pattern, remarkably enhancing the light emitting efficiency.

Also, since the insulating member with the predetermined pattern is removed using the wet etching, minimizing a damage of the nitride semiconductor layer.

Also, the second embodiment of the present invention can be applied to the semiconductor light emitting device of the NPN junction structure to enhance the light emitting efficiency.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A semiconductor light emitting device, comprising:
a semiconductor light emitting structure including at least one first conductive GaN based semiconductor layer, an active layer, and at least one second conductive GaN based semiconductor layer, wherein the semiconductor light emitting structure only includes semiconductor multi-layers;
a plurality of insulating members disposed from the at least one second conductive GaN based semiconductor layer through a portion of the at least one first conductive GaN based semiconductor layer, wherein each of the insulating members includes a reverse trapezoidal cross section having a top wider than a base and a top surface of the insulating members protrudes above a top surface of the semiconductor light emitting structure; and
a first electrode directly contacting an entire top surface of the at least one first conductive GaN based semiconductor layer and the entire top surface of the plurality of insulating members,
wherein the insulating members include a lower part contacting with one of the at least one first and the at least one second conductive GaN based semiconductor layers and an upper part contacting with another of the at least one first and the at least one second conductive GaN based semiconductor layers,
wherein the insulating members are not disposed on a top surface of the semiconductor light emitting structure, and
wherein an entire lowermost surface of the insulating members is in contact with the semiconductor light emitting structure and the entire top surface of the insulating members is not in contact with the semiconductor light emitting structure.

2. The semiconductor light emitting device according to claim 1, wherein the at least one first conductive GaN based semiconductor layer, the active layer and the at least one second conductive GaN based semiconductor layer have a common exposed side portion.

3. The semiconductor light emitting device according to claim 1, wherein the insulating members are spaced substantially a same distance apart.

4. The semiconductor light emitting device according to claim 1, wherein the insulating members comprise at least one of $SiO_2$ or $Si_xN_x$.

5. The semiconductor light emitting device according to claim 1, wherein a first base angle of the lower part is from 10° to 80°.

6. The semiconductor light emitting device according to claim 1,
wherein a first base angle of the lower part is different from a second base angle of the upper part, and
wherein the active layer comprises $In_xGa_yN_z$.

7. The semiconductor light emitting device according to claim 1, wherein the at least one second conductive GaN based semiconductor layer comprises an $Al_xGa_yN_z$ layer.

8. The semiconductor light emitting device according to claim 1,
wherein the at least one second conductive GaN based semiconductor layer comprises a plurality of p-type conductive layers, and
wherein at least one of the plurality of p-type conductive layers has a thickness of several hundreds to several thousands Å.

9. The semiconductor light emitting device according to claim 1, wherein the at least one second conductive GaN based semiconductor layer includes an AlGaN layer, and
wherein an area of a first surface of the AlGaN layer adjacent to the active layer is different from an area of at least one of a top surface and a bottom surface of the AlGaN layer.

10. The semiconductor light emitting device according to claim 9, further comprising:
   a third conductive GaN based semiconductor layer above the active layer, having a conductive property equal to a first conductive property of the at least one first conductive GaN based semiconductor layer.

11. The semiconductor light emitting device according to claim 9, wherein the at least one first conductive GaN based semiconductor layer, the active layer and the at least one second conductive GaN based semiconductor layer have a common exposed side portion.

12. The semiconductor light emitting device according to claim 9, wherein the insulating members are spaced substantially a same distance apart.

13. The semiconductor light emitting device according to claim 9, wherein the insulating members comprise at least one of $SiO_2$ or $Si_xN_x$.

14. The semiconductor light emitting device according to claim 9, wherein the insulating members reflect light generated in the active layer toward an outside of the semiconductor light emitting device.

15. The semiconductor light emitting device according to claim 9,
   wherein the at least one second conductive GaN based semiconductor layer comprises a plurality of p-type conductive layers, and
   wherein at least one of the plurality of p-type conductive layers has a thickness of several hundreds to several thousands Å.

* * * * *